(12) United States Patent
Priewasser

(10) Patent No.: US 7,520,309 B2
(45) Date of Patent: Apr. 21, 2009

(54) METHOD FOR ADHERING PROTECTING TAPE OF WAFER AND ADHERING APPARATUS

(75) Inventor: Karl Heinz Priewasser, Munich (DE)

(73) Assignee: Disco Corporation (JP)

( * ) Notice: Subject to any disclaimer, the term of this patent is extended or adjusted under 35 U.S.C. 154(b) by 57 days.

(21) Appl. No.: 11/495,121

(22) Filed: Jul. 28, 2006

(65) Prior Publication Data

US 2007/0026640 A1    Feb. 1, 2007

(30) Foreign Application Priority Data

Jul. 29, 2005  (JP) ............................. 2005-221445

(51) Int. Cl.
*B29C 65/00*    (2006.01)
(52) U.S. Cl. ............. 156/382; 156/580; 100/240; 100/244; 100/246; 269/21
(58) Field of Classification Search ........... 156/285, 156/382, 556, 379.6, 296, 580; 438/464; 100/138, 179, 183, 214, 240, 244, 246, 315, 100/316, 324; 269/21
See application file for complete search history.

(56) References Cited

U.S. PATENT DOCUMENTS 6,304,311 B1 * 10/2001 Egami et al. ................. 349/189
6,471,806 B1 * 10/2002 McKenna et al. ............ 156/160
6,868,888 B2 *  3/2005 Adachi ........................ 156/540

FOREIGN PATENT DOCUMENTS

JP    2001-148412    5/2001

* cited by examiner

*Primary Examiner*—Richard Crispino
*Assistant Examiner*—Christopher Schatz
(74) *Attorney, Agent, or Firm*—Brinks Hofer Gilson & Lione

(57) ABSTRACT

A method for adhering a protecting tape to a protection surface of a wafer is disclosed. The method comprises: cutting the protecting tape of which one surface is processed to be an adhering surface into predetermined size and shape; storing the protecting tape so as to release tensile force therein; holding the protecting tape by a protecting tape holding device; holding the wafer by a wafer holding device; locating the protecting tape and the wafer in a vacuum chamber in such a way that the adhering surface and the protection surface are facing each other; evacuating an interior of the vacuum chamber; and bringing the protecting tape holding device and/or the wafer holding device close to each other, thereby adhering the adhering surface of the protecting tape and the protection surface of the wafer.

2 Claims, 3 Drawing Sheets

(a)

(b)

METHOD FOR ADHERING PROTECTING TAPE OF WAFER AND ADHERING APPARATUS

This application claims priority under 35 U.S.C. §119 to Japanese Patent Application No. JP2005-221445 filed Jul. 29, 2005, the entire content of which is hereby incorporated by reference.

BACKGROUND OF THE INVENTION

1. Field of the Invention

The present invention relates to a method and an apparatus for adhering a protecting tape to a front surface of a wafer such as a semiconductor wafer or the like used as a substrate of electronic devices.

2. Description of the Related Arts

A semiconductor chip in which an electronic circuit such as an IC, an LSI or the like is formed in a front surface thereof is manufactured via a process of comparting lattice-shaped rectangular areas on the front surface of a disc-shaped semiconductor wafer by cut lines called streets, forming an electronic circuit in the rectangular areas and thereafter dividing the semiconductor wafer along the streets.

In the manufacturing process mentioned above, in the semiconductor wafer, a rear surface in an opposite side to a device surface in which the electronic circuit is formed is cut in accordance with a grinding by a grinder, or by device of a chemical etching, before the semiconductor wafer is divided into the semiconductor chips, whereby an entire thickness is reduced. Making the semiconductor wafer thin as mentioned above aims to improve a heat dissipation performance so as to maintain a performance in addition to making a device itself mounting the semiconductor wafer thereon thin or compact, or light in weight, and is executed, for example, to a thickness equal to or less than 200 to 100 μm or equal to or less than 50 μm, from an original thickness of 600 μm.

In this case, when making the semiconductor wafer thin as mentioned above, a protecting tape is adhered to the front surface of the semiconductor wafer for protecting the electric circuit on the front surface from contamination and damage. A technique to adhere the protecting tape mentioned above to the semiconductor wafer is disclosed, for example, in Japanese Unexamined Patent Publication No. 2001-148412 (paragraphs 0041 to 0049 and the like).

The technique described in this document is structured such that a protecting tape wound around an installation roll is draw out while detaching a liner paper therefrom, first an adhesive surface of the protecting tape is attached to an adhering table while keeping an expanded condition. Then, a non-adhesive surface of the protecting tape is adsorbed by an adsorption table, and the protecting tape adsorbed by the adsorption table is cut into a predetermined size and shape. Next, the cut protecting tape is adhered to a wafer within a vacuum chamber.

In the prior art described above, since the protecting tape is applied to the wafer in vacuum, bubbles are not remained between both the elements and generation of wrinkle can be inhibited. However, in the above technique, the protecting tape keeps the extended condition in which the protecting tape is drawn out from the installation roll after it was drawn out from the installation roll and attached to the adhering table till it is adhered to the wafer. In the extended condition, tensile force is applied to the protecting tape, and stress to contract to be free condition remains. If the protecting tape in this condition is adhered to the wafer and a thinning process is applied thereto as mentioned above, a warp is generated in the wafer by a tensile force of the protecting tape, and there is a risk that the wafer is broken in some cases.

Pre-dicing method is applied for a manufacturing method of a semiconductor chip in stead of the above mentioned general step in which a wafer is divided into chips after thinning the wafer. The pre-dicing method is performed by forming cuts in a lattice shape on the front surface at about a half of the thickness along the street comparting the formed electronic circuit, thereafter applying the protecting tape to the front surface thereof, and next cutting the back face in accordance with the grinding or the like till reaching the cut. In the case of employing the manufacturing method mentioned above, an adhesive bonding film (for example, a die attach film (DAF)) for mounting the semiconductor chip to the substrate is applied to the rear surface of the semiconductor wafer in a condition in which the divided individual semiconductor chips are coupled by the protecting tape, and only the adhesive film is thereafter cut along the street.

In the case of employing the method mentioned above, if the protecting tape to which the tensile force is applied as mentioned above is attached to the semiconductor wafer, a disarrangement is generated in the lattice-shaped array of the semiconductor chips due to the tensile force of the protecting tape, at a time of cutting the rear surface till reaching the cut and dividing into the semiconductor chips. In this case, since the cut line is not formed as a straight line but is formed as a distorted shape at a time of thereafter cutting the adhesive bonding film, it takes a lot of trouble with cutting and a reduction of a production efficiency is caused.

SUMMARY OF THE INVENTION

Accordingly, an object of the present invention is to provide a adhering method and a adhering apparatus of a protecting tape of a wafer, which can keep an original flat condition of a wafer to which the protecting tape is attached without deformation, by doing away with a trouble that a deformation such as a warp or the like is generated in the wafer on the basis of an effect of a tensile force applied to the protecting tape after attaching the protecting tape to the wafer, whereby it is possible to suppress a reduction of a production efficiency.

The present invention provides a method for adhering a protecting tape to a protection surface of a wafer, the method comprising: cutting the protecting tape of which one surface is processed to be an adhering surface into predetermined size and shape; storing the protecting tape so as to release tensile force therein; holding the protecting tape by a protecting tape holding device; holding the wafer by a wafer holding device; locating the protecting tape and the wafer in a vacuum chamber in such a way that the adhering surface and the protection surface are facing each other; evacuating an interior of the vacuum chamber; and bringing the protecting tape holding device and/or the wafer holding device close to each other, thereby adhering the adhering surface of the protecting tape and the protection surface of the wafer.

In accordance with the method of the invention, since the protecting tape prepared in a condition in which tensile force is previously released is attached to the wafer, no tensile force is left in the protecting tape attached to the wafer. Accordingly, an adverse effect by the tensile force of the protecting tape is not generated in the wafer. For example, even if the thinning process is applied after applying the protecting tape, the warp on the basis of the tensile force of the protecting tape is not generated, and the flat condition can be kept. Furthermore, in the case of employing the pre-dicing method, the disarrangement of the array of the semiconductor chips is not caused by the tensile force of the protecting tape after dividing into a plurality of semiconductor chips, and it is possible to smoothly execute the cutting work of the adhesive bonding film such as the DAF or the like thereafter attached thereto. Furthermore, since the protecting tape is attached to the wafer in vacuum, it is possible to obtain a normal attached condition in which an entire surface is closely contacted, without the bubbles being mixed between both the elements and the wrinkle being generated.

The present invention further provides an apparatus for adhering a protecting tape to a protection surface of a wafer, comprising: a protecting tape storing device for storing the protecting tape of which one surface is processed to be an adhering surface and which is cut into predetermined size and shape, thereby releasing tensile force in the protecting tape; a vacuum chamber; a wafer holding device disposed in the vacuum chamber for holding the wafer while exposing the protection surface; a protecting tape holding device disposed in the vacuum chamber and facing the wafer holding device for holding the protecting tape while exposing the adhering surface thereof; and an abutting device for bringing the protecting tape holding device and/or the wafer holding device close to each other, thereby abutting the adhering surface of the protecting tape to the protection surface of the wafer.

In accordance with the apparatus, the wafer is held by the wafer holding device, the protecting tape stored by the protecting tape storing device is held by the protecting tape holding device, these holding device are arranged within the vacuum chamber, and the adhesive surface of the protecting tape and the protected surface of the wafer are faced to each other. If the pressing device is actuated after forming a vacuum within the vacuum chamber from this condition, the adhesive surface of the protecting tape is pressed against the protected surface of the wafer, and the protecting tape is attached to the wafer.

Since the protecting tape is stored by the protecting tape storing device in the condition in which the tensile force is previously released, and the protecting tape is attached to the wafer, the adverse effect due to the tensile force of the protecting tape is not generated in the wafer, as mentioned in the description of the method in accordance with the present invention mentioned above.

It is preferable in treating that a liner sheet is pasted to the adhesive surface of the protecting tape stored by the protecting tape storing device, and the apparatus in accordance with the present invention is preferably provided with a detaching device detaching the liner sheet.

As an embodiment of the vacuum chamber of the present invention, the vacuum chamber may be a cylinder of which both ends are opened. In this case, the protecting tape holding device may be inserted into and extracted from the vacuum chamber through one of the opened ends, and the wafer holding device may be inserted into and extracted from the vacuum chamber through another opened end.

Furthermore, as another embodiment of the vacuum chamber of the invention, the vacuum chamber comprises a chamber body forming a container, and a hatch member which is rotatably connected to the chamber body via a hinge structure so as to open and close an inner space of the chamber body. In this case, the protecting tape holding device may be provided in one of the chamber body and the hatch member, and the wafer holding device may be provided in the other of the chamber body and the hatch member.

Furthermore, as an embodiment of the protecting tape holding device and the wafer holding device, a vacuum chuck type adsorption plate is employed preferably in a point that the vacuum chuck type adsorption plate can securely hold the protecting tape and the wafer in a condition in which one face is exposed.

A major point of the present invention is attaching the protecting tape in the condition in which the tensile force is released to the wafer. Accordingly, it is possible to do away with the problem that the deformation such as the warp or the like is generated in the wafer on the basis of the effect of the tensile force applied to the protecting tape after attaching the protecting tape to the wafer, and it is possible to keep the wafer to which the protecting tape is attached in the original flat condition with no deformation, whereby there is achieved an effect that it is possible to suppress the reduction of the production efficiency.

DESCRIPTION OF THE PREFERRED EMBODIMENTS

[1] First Embodiment

A description will be given below of a first embodiment in accordance with the present invention with reference to FIGS. 1 to 3.

(a) Structure of Apparatus

Figure 1:
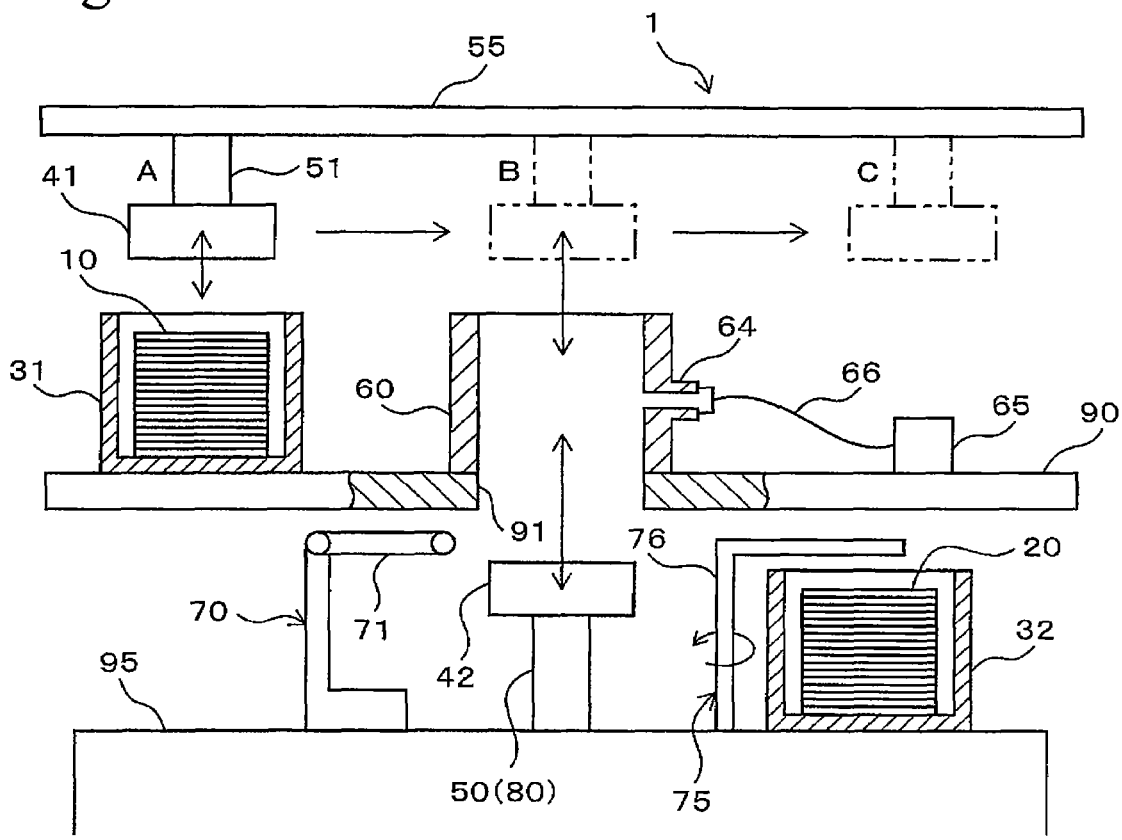
FIG. 1 is a partially broken front view of an apparatus for adhering a protecting tape of an embodiment of the invention.

FIG. 1 shows an entire of a protecting tape adhering apparatus 1 in accordance with the first embodiment. In the drawing, reference numeral 90 denotes an upper base plate. A lower base plate 95 is provided in a lower side of the upper base plate 90 at an interval. A vacuum chamber 60 is installed in the center on the upper base plate 90, and a wafer cassette 31 is detachably installed in a left side in the drawing of the vacuum chamber 60. A plurality of semiconductor wafers (hereinafter, refer to as wafers) 10 are stored within the wafer cassette 31 in a laminated manner.

The wafer 10 is formed in a thin disc shape, and is structured such that an electronic circuit of semiconductor chips comparted in a lattice shape by streets is formed in a front surface, and a rear surface side is ground to a thickness close to a product by a grinder or the like. The adhering apparatus 1 is structured such that a protecting tape for protecting the electronic circuit is attached to the front surface of the wafer 10. The wafers 10 are stored within the wafer cassette 31 in a condition in which the front surface to which the protecting tape is attached is directed downward.

The wafers 10 within the wafer cassette 31 are picked up one by one by a disc-shaped wafer adsorption plate 41 so as to be held. The wafer adsorption plate 41 is of a well-known vacuum chuck type, and is fixed to a lower end portion of a telescopic beam 51 in a condition in which a horizontal adsorption surface adsorbing the wafer 10 is directed downward. The telescopic beam 51 is structured such as to expand and contract with respect to a lower side, and is movably attached to a rail 55 extending in a horizontal direction in FIG. 1.

The wafer adsorption plate 41 is moved up and down on the basis of an expansion and contraction of the telescopic beam 51, and moves along the rail 55 together with the telescopic beam 51. The telescopic beam 51 and the wafer adsorption plate 41 are stopped at each of a wafer unloading position A shown by a solid line in FIG. 1, a protecting tape attaching position B on the vacuum chamber 60, and a wafer collecting position C in a right side thereof, with respect to the rail 55.

The telescopic beam 51 is expanded at the wafer unloading position A so as to move down, whereby the wafer adsorption plate 41 moves forward into the wafer cassette 31. Furthermore, it moves down until it is brought into contact with one wafer 10 mounted at the highest position within the wafer cassette 31 or it is close thereto, and adsorbs the wafer 10 to a lower face thereof so as to hold by being actuated in such a manner as to suck an air. The telescopic beam 51 is contracted so as to be moved up while keeping the holding operation, whereby the wafer 10 is unloaded from the wafer cassette 31, and is next moved to the protecting tape attaching position B.

The vacuum chamber 60 is formed in a cylindrical shape in which both end portions are open, and is fixed to the upper base plate 90 in a condition in which an axial direction is orthogonal to an upper surface of the upper base plate 90. A circular hole 91 communicating with an inner portion of the vacuum chamber 60 is formed in the upper base plate 90. The hole 91 is set to a size which is equal to or slightly larger than an inner diameter of the vacuum chamber 60, and the vacuum chamber 60 is arranged in the upper base plate 90 so as to be coaxial with the hole 91. An inner diameter of the vacuum chamber 60 is set such a size that the wafer adsorption plate 41 moving down from the protecting tape attaching position B can be charged.

Figure 2:
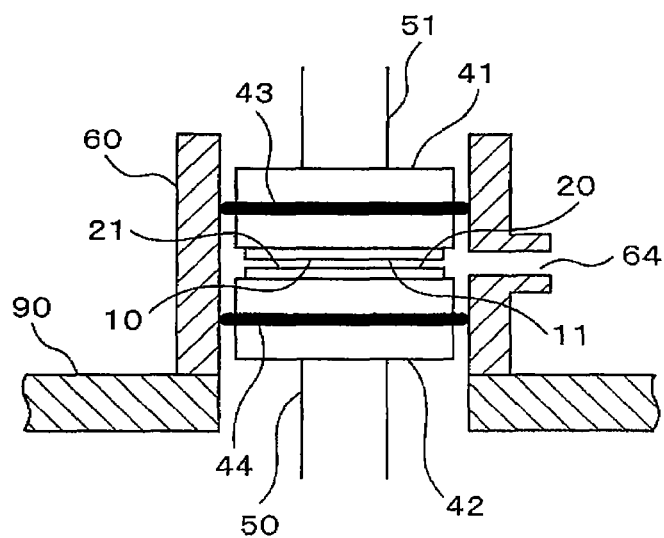
FIG. 2 is a cross section showing a condition in which a protecting tape is adhered to a wafer a vacuum chamber in the embodiment.

If the wafer adsorption plate 41 is moved down from the protecting tape attaching position B, the wafer adsorption plate 41 is charged into the vacuum chamber 60 as shown in FIG. 2. A seal ring 43 for keeping an air tight by sliding along the inner surface of the vacuum chamber 60 is installed to a peripheral surface of the wafer attaching plate 41.

The vacuum chamber 60 is provided with an exhaust port 64 in a portion having about a half height, and a vacuum pump 65 placed on the upper base plate 90 is connected to the exhaust port 64 via a pipe 66. The air within the vacuum chamber 60 is evacuated so as to be vacuumed by actuating the vacuum pump 65.

On the other hand, a telescopic post 50 expanding and contracting with respect to an upper side is installed in a lower side of the vacuum chamber 60 on the lower base plate 95, and a protecting tape adsorption plate 42 is fixed to a lower end portion of the telescopic post 50. The protecting tape adsorption plate 42 has the same structure and size as those of the wafer adsorption plate 41, and is arranged horizontally in a condition in which an adsorbing surface is directed upward. The protecting tape adsorption plate 42 is moves up and down in accordance with the expansion and contraction of the telescopic post 50.

A tape cassette 32 and a pickup robot 75 are installed in a right side in FIG. 1 of the telescopic post 50, and a detaching mechanism 70 is installed in a left side, respectively.

Figure 3A:
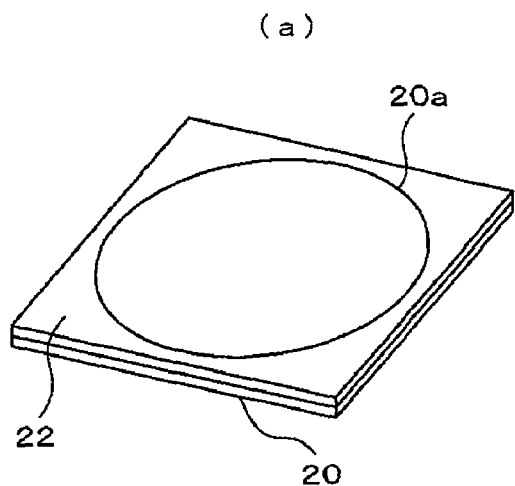
FIG. 3A is a schematic view of a protecting tape with a liner sheet, which is cut and stored in a tape cassette.

The tape cassette 32 is detachably installed, and in an inner portion of the tape cassette 32, there are stocked in a laminated condition a plurality of protecting tapes 20 having a liner sheet 22 attached to one paste surface and cut in an optional shape (a square shape in an illustrated embodiment) in correspondence to the magnitude of the wafer 10, as shown in FIG. 3A. The protecting tape 20 cut in the square shape is stored within the tape cassette 32 in a condition in which the tensile force is released, in other words, in a condition in which the tensile force is neither applied nor remains.

Figure 3B:
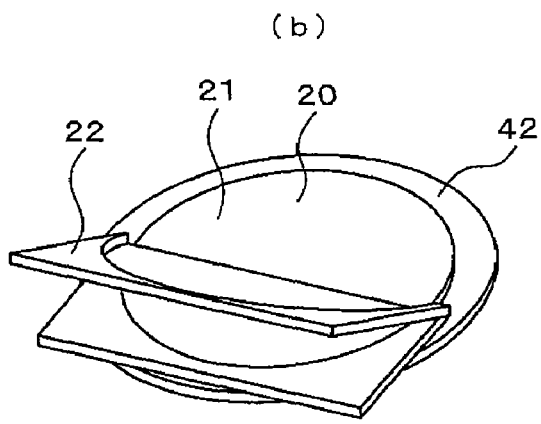
FIG. 3B is a schematic view showing a condition in which the liner sheet is detached from the protecting tape held by a tape adsorption plate.

As shown in FIG. 3A, a cut line 20a is formed in the square protecting tape 20 in such a manner that a center circular portion actually attached to the wafer 10 is left at the same shape and dimension as the front surface of the wafer 10, and an outer undesired portion is peeled together with the liner sheet 22 with leaving the circular portion, as shown in FIG. 3B.

The protecting tape 20 is stored within the tape cassette 32 in a condition in which the liner sheet 22 side is directed upward, and the protecting tape 20 mounted at the highest portion is unloaded one by one from the tape cassette 32 by the pickup robot 75, and is moved onto the protecting tape adsorption plate 42 moving down to a standby position. The pickup robot 75 is provided with a function of adsorbing the protecting tape 20 to a leading end of the arm 76 so as to pick up, and mounting the protecting tape 20 onto the protecting tape adsorption plate 42 by swiveling the arm 76.

If the protecting tape adsorption plate 42 is actuated in such a manner as to suck the air, the protecting tape 20 is adsorbed to the adsorption surface so as to be held. In this condition, the left adjacent detaching mechanism 70 is actuated, whereby the liner sheet 22 of the protecting tape 20 is peeled, and only the circular portion of the protecting tape 20 is left on the protecting tape adsorption plate 42 and is held in a condition in which an adhesive surface 21 is directed upward. The detaching mechanism 70 is a generally well-known structure adhesive bonding the liner sheet 22 to a take-up tape 71 so as to peel.

If the telescopic post 50 is elongated and the protecting tape adsorption plate 42 is moved up from the standby position, the protecting tape adsorption plate 42 is charged into the vacuum chamber 60, as shown in FIG. 2. A seal ring 44 sliding along an inner surface of the vacuum chamber 60 so as to keep the air tight is installed to a peripheral surface of the protecting tape adsorption plate 42, in the same manner as the wafer adsorption plate 41.

In FIG. 2, the wafer adsorption plate 41 holding the wafer 10, and the protecting tape adsorption plate 42 holding the protecting tape 20 are charged within the vacuum chamber 60, the front surface (the protected surface) 11 of the wafer and the adhesive surface 21 of the protecting tape 20 are faced to each other in the condition in which they are slightly away and in parallel to each other, and the exhaust port 64 is provided between the seal rings 43 and 44. A position of each of the adsorption plates 41 and 42 is set as a preparation position just before attaching the protecting tape 20 to the wafer 10. When attaching the protecting tape 20 from the preparation position, the protecting tape adsorption plate 42 is moved up and the protecting tape 20 is pressed against the wafer 10.

(b) Operation of Apparatus

The above is the protecting tape adhering apparatus 1 in accordance with the first embodiment, and a description will be subsequently given below of an operation of the apparatus.

In this case, a series of operations described here form a specific example of a adhering method in accordance with the present invention.

The wafer adhesion plate 41 stopping at the wafer unloading position A is moved down so as to move forward into the wafer cassette 31, and adsorbs and holds one wafer 10. Next, the wafer adsorption plate 41 is moved up so as to be out of the wafer cassette 31, and is thereafter moved to the protecting tape attaching position B. Next, the wafer adsorption plate 41 is moved down, and the wafer adsorption plate 41 holding the wafer 10 in the condition in which the front surface 11 is directed downward is charged into the vacuum chamber 60 to the preparation position.

On the other hand, one protecting tape 20 within the tape cassette 32 is transferred on the protecting tape adsorption plate 42 existing at the standby position by the pickup robot 75, and is adsorbed and held on the protecting tape adsorption plate 42 in the condition in which the liner sheet 22 is directed upward. Next, the liner sheet 22 is peeled by the detaching mechanism 70. In the protecting tape 20, only the circular portion attached to the front surface of the wafer 10 is held to the protecting tape adsorption plate 42 in the condition in which the adhesive surface 21 is directed upward.

Next, the protecting tape adsorption plate 42 is moved up, and the protecting tape adsorption plate 42 holding the protecting tape 20 is charged into the vacuum chamber 60 to the preparation position. Accordingly, the front surface 11 of the wafer 10 and the adhesive surface 21 of the protecting tape 20 face to each other in the condition of being slightly away and in parallel to each other.

Subsequently, the vacuum chamber 60 is vacuumed by actuating the vacuum pump 65, and the adhesive surface 21 of the protecting tape 20 is thereafter pressed against the front surface 11 of the wafer 10 by slightly moving up the protecting tape adsorption plate 42. Accordingly, the protecting tape 20 is attached to the front surface 11 of the wafer 10.

If the attachment of the protecting tape 20 is finished, the adsorbing operations of the vacuum pump 65 and the adsorption plate 42 are stopped. Furthermore, the wafer adsorption plate 41 is moved up so as to be returned to the protecting tape attaching position B, and is further moved to the wafer collecting position C, and the wafer 10 to which the protecting tape 20 is attached is detached from the wafer adsorption plate 41 here. The wafer 10 is transferred to the next step of dividing into a plurality of semiconductor chips after removing the rear side of the wafer 10 so as to make thin.

Furthermore, in the adhering apparatus 1, the wafer adsorption plate 41 is returned to the wafer unloading position A, and the protecting tape adsorption plate 42 is moved down so as to be returned to the standby position. Furthermore, the attaching operation mentioned above is continuously repeated, and the protecting tape 20 is attached to a lot of wafers 10.

In accordance with the first embodiment mentioned above, since the protecting tape 20 stored in the condition in which the tensile force has been previously released is attached to the wafer 10, the tensile force is not left in the protecting tape 20 attached to the wafer 10. Accordingly, the adverse effect by the tensile force of the protecting tape 20 is not generated in the wafer 10.

Specifically, even if the thinning process is applied after the protecting tape 20 is attached, the warp due to the tensile force of the protecting tape 20 or the like is not generated in the wafer 10, and the flat condition is kept. Accordingly, no trouble is generated in the cutting work or the like for obtaining the semiconductor chips. Furthermore, since the protecting tape 20 is attached to the wafer 10 in vacuum, it is possible to obtain a normal attaching condition in which an entire surface is closely contacted, without the bubbles being mixed between both the elements and without the wrinkle being generated.

In this case, the wafer 10 treated in the first embodiment mentioned above is structured by forming the electronic circuit on the front surface, attaching the protecting tape 20 to the front surface and making thin, and thereafter dividing into the semiconductor chips, however, it is possible to treat a wafer in which the semiconductor chips are obtained by employing the pre-dicing method mentioned above.

The wafer in this case is structured such that the cut having about a half thickness is formed in the lattice shape along the streets, on the front surface in which the electronic circuit is formed, and the protecting tape 20 is attached to the front surface in which the cut is formed, in the manner mentioned above.

The wafer 10 to which the making tape 20 is attached is cut on the rear side till reaching the cut in accordance with the grinding or the like so as to be divided into the semiconductor chips. Since the divided semiconductor chips is in the condition of the wafer coupled by the protecting tape 20, and the deformation by the tensile force of the protecting tape 20 is not generated in the wafer, any disarrangement is generated in the array of the semiconductor chips. Furthermore, since no strain is generated in the streets and the straight line is maintained at a time of attaching the adhesive bonding film such as the DAF or the like for mounting the semiconductor chips to the substrate to the rear surface of the wafer 10, removing the protecting tape 20 and thereafter cutting the adhesive bonding film along the streets, there can be obtained a particular effect that it is possible to smoothly execute the cutting work.

[2] Second Embodiment

Next, a description will be given of a second embodiment in accordance with the present invention with reference to FIGS. 4 to 6.

(a) Structure of Apparatus

Figure 4:
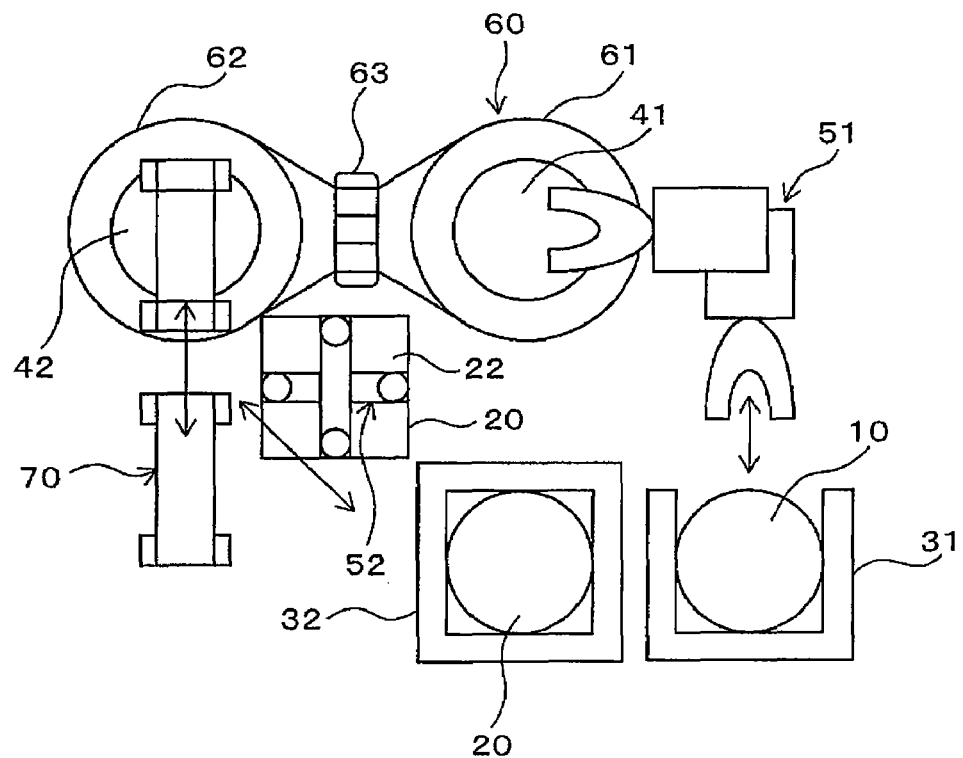
FIG. 4 is a plan view of an apparatus for adhering a protecting tape of another embodiment of the invention.

FIG. 4 shows an entire of a protecting tape adhering apparatus 2 in accordance with the second embodiment. The adhering apparatus 2 is also an apparatus for attaching the protecting tape 20 to the wafer 10 in accordance with the first embodiment. Reference numeral 60 in FIG. 4 denotes a vacuum chamber 60 mainly constituted by a chamber main body 61, and a lid body 62 opening and closing an internal space of the chamber main body 61. The chamber main body 61 and the lid body 62 have the same structure which is entirely formed in a disc shape, and is formed in a container shape in which a concave portion 68 is formed within a ring-shaped wall portion 67, as shown in FIGS. 5 and 6, and both the elements are rotatably coupled via a hinge 63.

Figure 5:
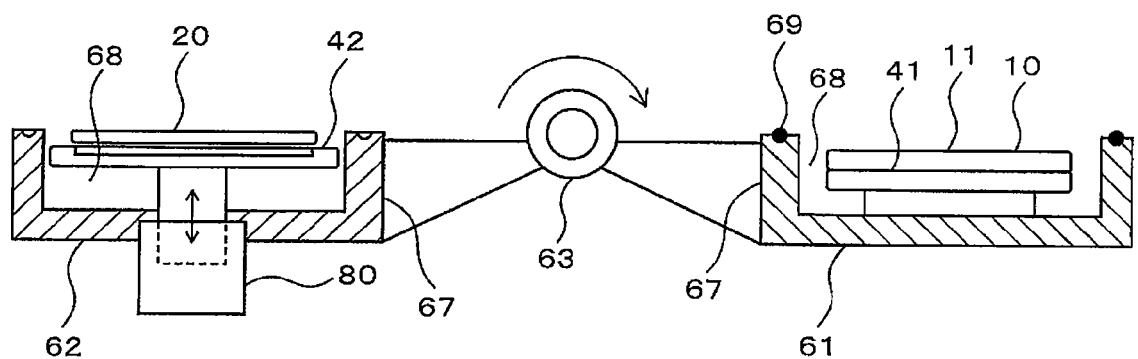
FIG. 5 is a side cross section of the apparatus for adhering a protecting tape of another embodiment of the invention, showing a condition in which a vacuum chamber is opened.
Figure 6:
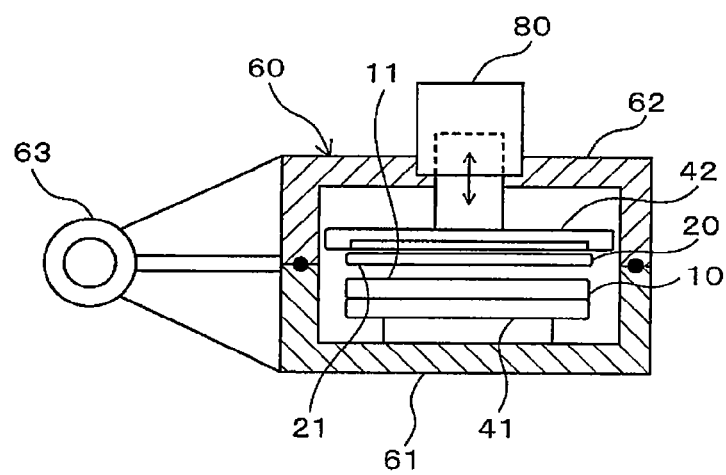
FIG. 6 is a side cross section showing a condition in which the vacuum chamber is crossed from the condition in FIG. 5.

When rotating the lid body 62 to the chamber main body 61 side from a condition in which the lid body 62 is open as shown in FIG. 5 so as to align the wall portions 67 with each other, the vacuum chamber 60 in which the internal space is closed is structured, as shown in FIG. 6. A seal ring 69 for making the inner side of the vacuum chamber 60 airtight in the closed condition is installed to the mating face of the wall portion 67 in the chamber main body 61 side to the lid body 62. The inner side of the vacuum chamber 60 is evacuated by the vacuum pump 65 (not shown).

As shown in FIG. 5, the vacuum chuck type wafer adsorption plate 41 is fixed to a bottom surface of the chamber main body 61, and the wafer 10 is adhered and held onto the wafer adsorption plate 41 in the condition in which the front surface (the protected surface) 11 is directed upward. On the other hand, the vacuum chuck type protecting tape adsorption plate 42 is attached to a bottom surface of the lid body 62 via a cylinder (a pressing device) 80, and the protecting tape 20 is adsorbed and held onto the protecting tape adsorption plate 42 in the condition in which the liner sheet 22 is directed upward. The protecting tape adsorption plate 42 is reciprocated in a direction moving away from and close to the lid body 62, by the cylinder 80.

As shown in FIG. 4, the wafer cassette 31 storing the wafer 10 and the tape cassette 32 storing the making tape 20 are respectively arranged near the vacuum chamber 60. In the same manner as the first embodiment mentioned above, the rectangular protecting tape 20 to which the liner sheet 22 is attached to the adhesive surface is stored within the tape cassette 32 in the condition in which the tensile force is released.

The wafer 10 within the wafer cassette 31 is carried on the wafer adsorption plate 41 within the chamber main body 61 by a wafer carrier mechanism 51, and the protecting tape 20 within the tape cassette 32 is structured such as to be carried on the protecting tape adsorption plate 42 within the lid body 62 in the open condition, by a tape carrier mechanism 52. Furthermore, the detaching mechanism 70 detaching the liner sheet 22 of the protecting tape 20 held on the protecting tape adsorption plate 42 is arranged near the open lid body 62.

(b) Operation of Apparatus

Next, a description will be given of an operation of the adhering apparatus 2 in accordance with the second embodiment mentioned above.

First, as shown in FIG. 5, the vacuum chamber 60 is previously set to a condition in which the lid body 62 is open. Furthermore, one wafer 10 is unloaded from the wafer cassette 31 by the wafer carrier mechanism 51, and the wafer 10 is mounted on the wafer adsorption plate 41 of the chamber main body 61 in the condition in which the front surface 11 is directed upward, thereby being adsorbed and held.

In parallel thereto, one protecting tape 20 is unloaded from the tape cassette 32, and the protecting tape 20 is mounted on the protecting tape adsorption plate 42 of the lid body 62 in the condition in which the liner sheet 22 is directed upward, thereby being adsorbed and held. Next, the liner sheet 22 is peeled by the detaching mechanism 70, and the circular protecting tape 20 is held by the protecting tape adsorption plate 42 in the condition in which the adhesive surface is directed upward.

Next, the lid body 62 is rotated and the vacuum chamber 60 is closed. At this time, as shown in FIG. 6, the protecting tape 20 held by the protecting tape adsorption plate 42 is positioned in parallel slightly above the wafer 10 held by the wafer adsorption plate 41, and the front surface 11 of the wafer 10 and the adhesive surface 21 of the protecting tape 20 are faced to each other slightly away each other.

Subsequently, the vacuum chamber 60 is evacuated by actuating the vacuum pump, the protecting tape adsorption plate 42 is thereafter moved down by the cylinder 80, and the adhesive surface 21 of the protecting tape 20 is pressed against the front surface 11 of the wafer 10. Accordingly, the protecting tape 20 is attached to the front surface 11 of the wafer 10. If the attachment of the protecting tape 20 is finished, the adsorbing operation of the vacuum pump and each of the adsorption plates 41 and 42 is stopped. Furthermore, the lid body 62 is opened, and the wafer 10 to which the protecting tape 20 is attached on the wafer adsorption plate 41 is transferred to the next step.

The operations mentioned above are continuously repeated, and the protecting tape 20 is attached to a lot of wafers 10.

In accordance with the adhering apparatus of the second embodiment mentioned above, it is possible to obtain the effect obtained by attaching the protecting tape 20 in which the tensile force is released to the wafer 10, in the same manner as the first embodiment. Furthermore, particularly, since the adhering apparatus 2 in accordance with the second embodiment is provided with the adsorption plates 41 and 42 for the wafer 10 and the protecting tape 20 in the open and close type vacuum chamber 60, the structure of carrying the adsorption plates 41 and 42 so as to take them in and out the vacuum chamber 60 is not necessary. Accordingly, there can be obtained an advantage that the structure of the apparatus becomes simple, and the apparatus can be made compact in size.

What is claimed is:

1. An apparatus for adhering a protecting tape to a protection surface of a wafer, comprising:
    a protecting tape storing device for storing the protecting tape of which one surface is processed to be an adhering surface and which is cut into predetermined size and shape, thereby releasing tensile force in the protecting tape;
    a vacuum chamber;
    a wafer holding device disposed in the vacuum chamber for holding the wafer while exposing the protection surface;
    a protecting tape holding device disposed in the vacuum chamber and facing the wafer holding device for holding the protecting tape while exposing the adhering surface thereof; and
    an abutting device for bringing the protecting tape holding device and/or the wafer holding device close to each other, thereby abutting the adhering surface of the protecting tape to the protection surface of the wafer,
    wherein the vacuum chamber is a cylinder of which both ends are opened,
    the protecting tape holding device is inserted into and extracted from the vacuum chamber through one of the opened ends, and
    wafer holding device is inserted into and extracted from the vacuum chamber through another opened end,
    wherein a seal ring sliding along an inner surface of the vacuum chamber is installed to a peripheral surface of the protecting tape holding device, and a seal ring sliding along the inner surface of the vacuum chamber is installed to a peripheral surface of the wafer holding device, and
    the protecting tape holding device functions as a cap for closing the one opened end, and the wafer holding device functions as a cap for the another opened end.

2. The apparatus for adhering a protecting tape to a protection surface of a wafer according to claim 1,
    wherein the adhering surface of the protecting tape which is stored in the protecting tape storing device is covered with a liner sheet, and the apparatus further comprises a detaching device for detaching the liner sheet from the protecting tape.

* * * * *